United States Patent [19]

Kinoshita et al.

[11] Patent Number: 4,743,874
[45] Date of Patent: May 10, 1988

[54] MAGNETOSTATIC WAVE TUNABLE RESONATOR

[75] Inventors: Yasuaki Kinoshita, Hachioji; Satoshi Sugawara, Sendai, both of Japan

[73] Assignees: Hitachi, Ltd.; Hitachi Video Eng. Inc., both of Tokyo, Japan

[21] Appl. No.: 39,290

[22] Filed: Apr. 17, 1987

[30] Foreign Application Priority Data

Apr. 18, 1986 [JP] Japan .................................. 61-88032

[51] Int. Cl.⁴ .............................................. H01P 7/06
[52] U.S. Cl. .................................... 333/219; 333/235; 333/245
[58] Field of Search ................. 333/219, 202, 141–156, 333/193–196, 246, 235, 245, 227, 230; 331/96, 107 SL, 107 DP

[56] References Cited

U.S. PATENT DOCUMENTS 4,199,737  4/1980  Patterson et al. ................... 333/154
4,528,529  7/1985  Huijer ................................. 333/219

Primary Examiner—Marvin L. Nussbaum
Attorney, Agent, or Firm—Antonelli, Terry & Wands

[57] ABSTRACT

A magnetostatic wave tunable resonator which has fine stripe electrodes and bonding electrode films formed on the surface of a YIG thin film supported by a GGG substrate. The stripe electrodes, bonding electrode films and edges of the YIG film are formed by a chemical etching method based on photolithography. The resonator so formed has suppressed spurious resonance of high order modes and enables the use of a magnet of greatly reduced size.

4 Claims, 4 Drawing Sheets

MAGNETOSTATIC WAVE TUNABLE RESONATOR

BACKGROUND OF THE INVENTION

(1) Field of the Invention

The present invention relates to a frequency tunable magnetostatic wave resonator which utilizes magnetic spin resonance of yttrium iron garnet (hereinafter referred to as YIG) film. More specifically, the invention relates to a wide-band frequency tunable integrated resonator that is produced from a thin YIG film grown on a gadolinium gallium garnet (hereinafter referred to as GGG) substrate by photolithography, the wide-band frequency tunable integrated resonator being adapted to be mounted in a small metallic package.

(2) Description of the Prior Art

As a magnetostatic wave resonator utilizing the magnetic spin resonance of YIG, the prior art has shown a small resonator in which a magnetic bias field is applied in the direction of YIG film to utilize magnetostatic waves that propagate through the YIG film (see IEEE, Ultrasonic Symposium, 1984, pp. 164–167).

The above known resonator resonates on a 12-GHz band using a 4 mm×1.4 mm square YIG/GGG chip as shown in FIG. 2.

In this case, however, it is not allowed to place on the chip a transducer which excites the magnetostatic waves, making it difficult to unitize the whole structure and to mount it in a small package. Further, consideration has not been given in regard to bringing the chip into alignment with the transducers.

The object of the present invention, therefore, is to realize a resonator which can be fabricated maintaining high precision and which requires a magnet of a small size.

SUMMARY OF THE INVENTION

In order to achieve the above-mentioned object according to the present invention, fine stripe electrodes for exciting the magnetostatic waves are formed on the surface of the YIG film and straight edges of the YIG film for reflecting the magnetostatic waves are constituted on the GGG substrate.

Employment of this structure makes it possible to form the stripe electrodes and YIG straight edges by the chemical etching method based upon photolithography, contributing to improve the machining precision to a degree that is equal to the dimensional precision on the mask surface.

Formation of a plurality of stripe electrodes on the surface of the YIG film helps suppress the spurious resonance of a high order mode. In this case, the machining precision on the reflection surface of the YIG straight edges may be roughly the same as the width of an electrode finger. The magnet which applies a magnetic bias field can be so located that the magnetic pole surface thereof comes into contact with the chip, enabling the size of the magnet to be greatly reduced.

The above-mentioned and other features and objects of this invention will become more apparent by reference to the following description taken in conjunction with the accompanying drawings.

DESCRIPTION OF THE PREFERRED EMBODIMENTS

Figure 1A:
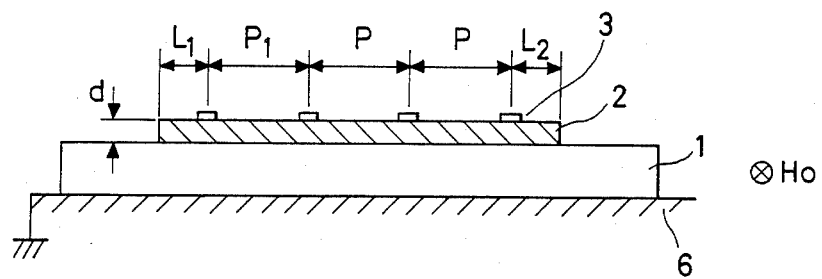
FIGS. 1(a) and 1(b) are a side section view and a plan view illustrating the structure of a magnetostatic wave resonator according to an embodiment of the present invention.
Figure 1B:
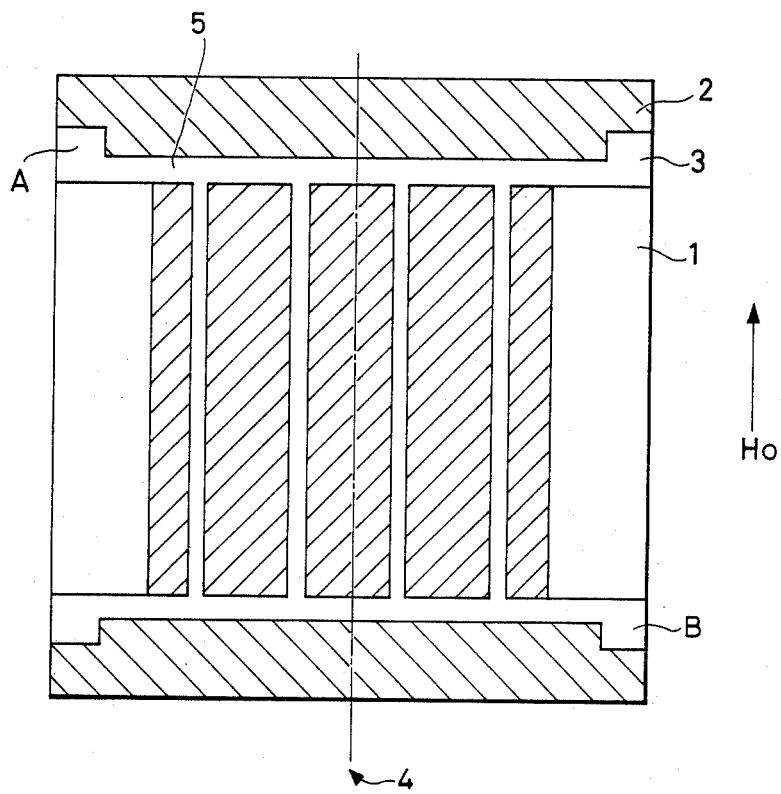

An embodiment of the invention will now be described in conjunction with FIG. 1, wherein FIG. 1(a) is a side view and FIG. 1(b) is a plan view. A YIG film 2 is grown by liquid phase epitaxy on a GGG substrate 1, and fine stripe electrodes 3 of thin aluminum film are formed on the surface of the YIG film 2 by photolithography.

The stripe electrodes are much narrower than a pitch P, and both ends thereof are connected in parallel, thereby to form a four-terminal device in which a terminal A and a ground point receive inputs, and a terminal B and a ground point produce outputs. Portions of the thin YIG film 2 more remote than the lenths $L_1$ and $L_2$ of the straight edges are removed by chemical etching at both ends that are in parallel with the stripe electrodes 3.

As a magnetic bias field $H_O$ is applied in the direction of YIG film 2, i.e., in the direction of stripe electrode fingers 3, the magnetostatic surface wave propagates in the direction of a right-handed thread on the YIG film 2 and through a boundary between the YIG film and the GGG substrate. The magnetostatic surface wave rotates in the clockwise direction at the right end from the surface into the boundary, and from the boundary into the surface at the left end, and resonance takes place at a frequency at which the total propagation length corresponds to a product of an integer number of the wavelength.

The resonance frequency can be varied by changing the magnetic field intensity. Therefore, the lengths $L_1$ and $L_2$ must be an interger number times ½ of the electrode finger pitch P. For the purpose of the simplest explanation, this embodiment deals with the case where $L_1=L_2=P/2$.

Figure 3:
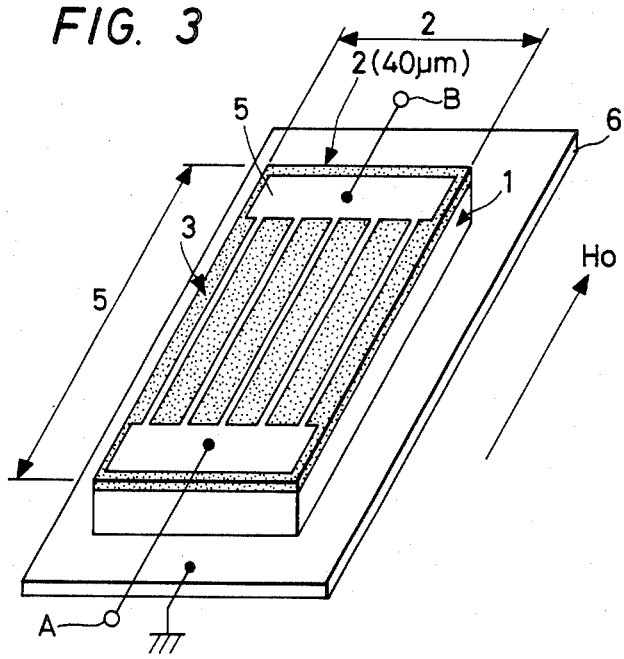
FIG. 3 is a perspective view of a chip resonator according to another embodiment of the present invention.

FIG. 3 explains another embodiment of the present invention. The magnetostatic wave is reflected by the straight edge cut by a scriber at the end of the YIG film. Experiment proved that a sufficiently sharp resonance response could be obtained when the coarseness of the straight reflection edge was of the order of when it was cut with the scriber, i.e., when the coarseness of the straight reflection edge was of the order of the electrode finger width, as will be described later.

Figure 2:
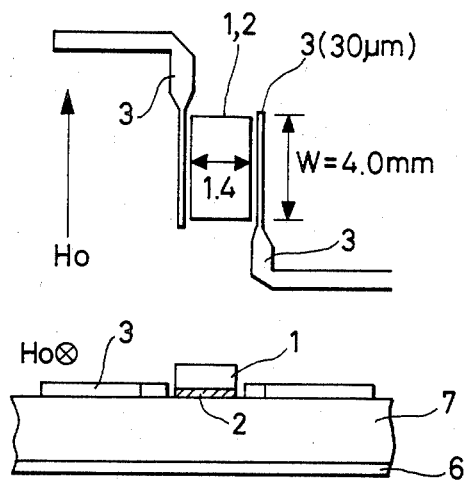
FIG. 2 includes a top view and a side view of a YIG/GGG chip resonator that has therefore been known.

The magnetic bias field applied to the YIG film must be as uniform as possible. Experiment proves that nonuniformity in the magnetic field deteriorates the sharpness of resonance response. It is therefore necessary to use a driving coil and a magnet that applies magnetic field having a sufficient uniformity of intensity distribution over the YIG film. It will be obvious that the structures of both FIGS. 1 and 3 makes it possible to reduce the sizes of the magnet and driving coil compared with those of the conventional example of FIG. 2.

Figure 4:
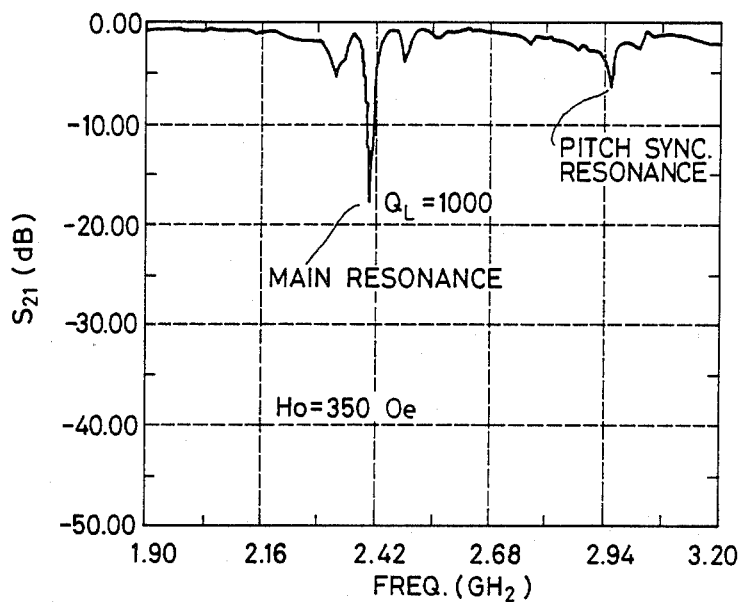
FIG. 4 is a graph showing frequency response characteristics of the magnetostatic wave resonator according to the embodiment of the present invention.

FIG. 4 shows an experimental example of the resonator of the invention. Three to five aluminum electrode-fingers having a width of 30 μm are formed on a 20 μm thick YIG film maintaining a pitch P=300 μm, and a magnetic bias field $H_O$=350 Oe is applied thereto. The thus obtained chip is placed on a conductor, and a scattering matrix parameter $S_{21}$ is measured with the terminal A and the conductor 6 shown in FIG. 1 as input terminals and the terminal B and the conductor 6 as output terminals. A main sharp resonance appears at 2.42 GHz when the loaded Q is $Q_L$=1000. A resonance point in synchronism with the pitch period P is also observed at 2.94 GHz, which, however, is smaller than the main resonance. The main resonance is very close to a frequency $f_c$ at which the propagation of the magnetostatic surface wave is cut off in a low-frequency region, $$2\pi f_c = \sqrt{\gamma H_i(\gamma H_i + 4\pi M\gamma)} \quad (1)$$

$H_i$: internal magnetic bias field in the YIG film,
$4\pi M$: saturation magnetization of YIG (1760 G),
γ: gyro-magnetic ratio 2π×2.8 MHz/Oe, and it is considered that the resonance takes place at a frequency $f_R$ at which the propagation length of the surface wave and the boundary wave become equal to one wavelength. The frequency $f_R$ is close to the frequency $f_c$ and remains nearly constant even when the overall length of the YIG film is slightly changed. Error of $L_1=L_2=P/2$ decreases the loaded Q of main resonance. The same resonance characteristics are observed even when the scattering matrix parameter $S_{11}$ is measured by connecting the terminal B and conductor 6 of FIG. 1 together, and using the terminal A and the conductor as two terminals. When the terminal B and the conductor 6 are opened, the resonance response is intensified owing to a relationship relative to the characteristic impedance of the measuring system. To change the resonance frequency, $H_i$ of the equation (1) should be changed, i.e., the external magnetic field $H_O$ should be changed. In FIG. 4, the frequency $f_R$ becomes 2.50 GHz if the external magnetic field $H_O$ is set to $H_O$=375 Oe.

The above experimental results indicate the fact that a plurality of electrode fingers suppress the spurious resonances of high-order modes other than the resonance in synchronism with the pitch. Therefore, the electrode fingers 3 do not need to be periodically arranged. It is desired that the electrode strips are symmetrically arranged with respect to a center line 4 of FIG. 1.

Experiments further indicate that areas of the electrode 5 connecting the bonding wires determine the magnitude of rejection of the response characteristics. It is necessary to optimize the electrostatic capacity of the bonding electrodes 5 with respect to ground.

Figure 5:
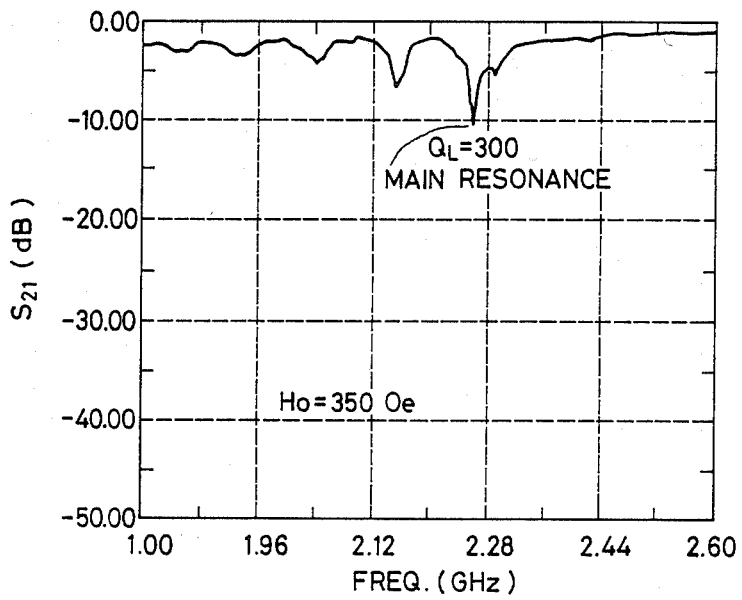
FIG. 5 is a graph showing frequency response characteristics of the magnetostatic wave resonator according to the another embodiment of the present invention.

A further embodiment of the present invention will now be described. The external magnetic field is applied in the direction of the surface of the YIG film perpendicularly to the stripe electrodes. FIG. 5 shows a scattering matrix parameter $S_{11}$ of when the magnetic field $H_O$=350 Oe is applied to the same sample as that of FIG. 4, the terminal B is connected to the lower conductor, and the terminal A and the conductor are used as two terminals. In this case, the magnetostatic backward volume wave is excited in the YIG film, and the main resonance takes place at $f_R$=2.26 GHz. A high cut-off frequency of the magnetostatic backward volume wave is equal to $f_c$ of the equation (1), and the main resonance frequency $f_R$ is lower than $f_c$ and is close to $f_c$. The backward volume waves are reflected by both straight edges of the YIG film, and are transformed into standing waves to resonate.

Figure 6:
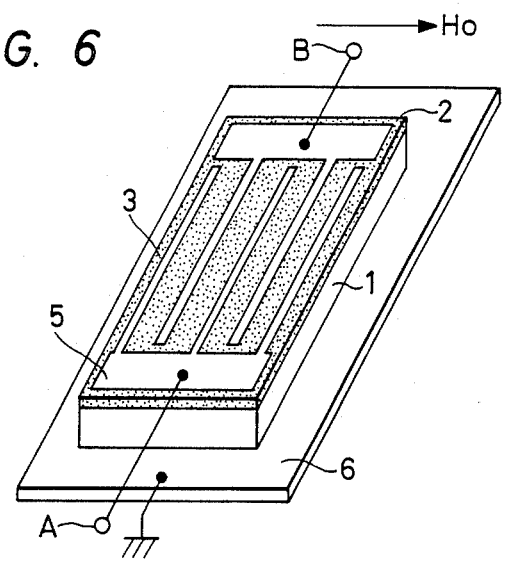
FIG. 6 is a perspective view of a magnetostatic wave resonator according to a further embodiment of the present invention.
Figure 7:
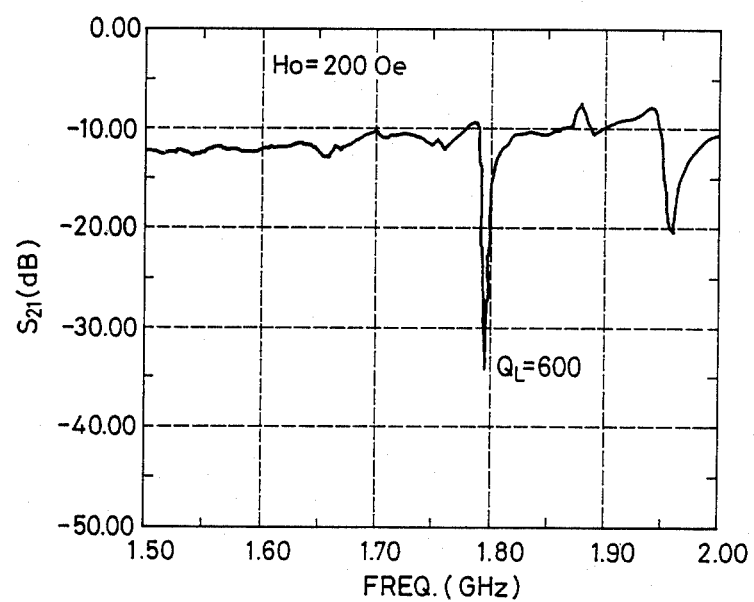
FIG. 7 is a graph showing frequency response characteristics of the resonator of FIG. 6.

FIG. 6 shows a futher embodiment of the present invention which deals with a resonance that uses magnetostatic backward volume waves by opposing two sets of stripe electrode fingers to each other in the staggered form to facilitate the impedance matching. FIG. 7 shows a scattering matrix parameter $S_{21}$ of when the inputs are input to the terminal A and to the ground point, and the outputs are produced from the terminal B and the ground point. The attenuation quantity of the blocking region is greatly improved compared with the case of FIG. 5. Insertion loss increases in the pass region, which, however, is improved by matching the input and output circuits.

What is claimed is:
1. A magnetostatic wave tunable resonator comprising:
   a conductive plane;
   a GGG (gadolinium/gallium/garnet) single crystalline substrate mounted on said conductive plane;
   a YIG (yttrium/iron/garnet) single crystalline film formed on said GGG substrate;
   bonding electrode films formed on said YIG film;
   a plurality of fine stripe electrodes formed on said YIG film, and connected to said bonding electrode films,
   wherein said stripe electrodes and said bonding electrode films are formed by a chemical etching method based on photolithography;
   whereby magnetostatic waves excited in said YIG film propagate therethrough, are reflected by straight edges of said YIG film, and are resonated, and wherein an applied magnetic field is changed to vary a resonance frequency.

2. A magnetostatic wave tunable resonator according to claim 1, wherein said stripe electrodes are symmetrically arranged with respect to a center line of the YIG film in the direction of the stripe electrodes.

3. A magnetostatic wave tunable resonator according to claim 1, wherein the distance between adjacent stripe electrodes is twice the distance between the outermost stripe electrodes and said straight edges of said YIG film.

4. A magnetostatic wave tunable resonator according to claim 1, wherein said stripe electrodes serve as input terminals to excite said magnetostatic waves in said YIG film.

* * * * *